(12) United States Patent
Chen et al.

(10) Patent No.: US 9,343,124 B1
(45) Date of Patent: May 17, 2016

(54) METHOD AND SYSTEM FOR OPERATING A MULTI-PORT MEMORY SYSTEM

(75) Inventors: Caroline Ssu-Min Chen, Milpitas, CA (US); Jeffrey Schulz, Milpitas, CA (US); Michael H. M. Chu, Fremont, CA (US); Ravish Kapasi, Fremont, CA (US)

(73) Assignee: Altera Corporation, San Jose, CA (US)

( * ) Notice: Subject to any disclaimer, the term of this patent is extended or adjusted under 35 U.S.C. 154(b) by 1065 days.

(21) Appl. No.: 13/194,842

(22) Filed: Jul. 29, 2011

(51) Int. Cl.
  *G06F 12/00* (2006.01)
  *G11C 7/10* (2006.01)
  *G06F 12/08* (2016.01)

(52) U.S. Cl.
  CPC .......... *G11C 7/1075* (2013.01); *G06F 12/0853* (2013.01)

(58) Field of Classification Search
  CPC ..... G06F 12/0853; G11C 7/1075; G11C 8/16
  See application file for complete search history.

(56) References Cited

U.S. PATENT DOCUMENTS

| | | | | |
|---|---|---|---|---|
| 5,745,915 A * | 4/1998 | Cooper et al. | | 711/114 |
| 5,784,582 A * | 7/1998 | Hughes | | 710/117 |
| 5,971,923 A * | 10/1999 | Finger | | 600/437 |
| 6,205,523 B1 * | 3/2001 | Joffe et al. | | 711/150 |
| 6,499,072 B1 * | 12/2002 | Frank et al. | | 710/100 |
| 6,501,734 B1 * | 12/2002 | Yu et al. | | 370/236 |
| 6,611,260 B1 * | 8/2003 | Greenberg et al. | | 345/204 |
| 2003/0126233 A1 * | 7/2003 | Bryers et al. | | 709/219 |
| 2005/0060456 A1 * | 3/2005 | Shrader et al. | | 710/240 |
| 2005/0165876 A1 * | 7/2005 | Mukaida et al. | | 708/523 |
| 2005/0226079 A1 * | 10/2005 | Zhu et al. | | 365/230.03 |
| 2007/0150669 A1 * | 6/2007 | Ahn et al. | | 711/150 |
| 2009/0150622 A1 * | 6/2009 | Allen et al. | | 711/154 |
| 2012/0069034 A1 * | 3/2012 | Biswas et al. | | 345/531 |

FOREIGN PATENT DOCUMENTS

WO       WO9505635       * 2/1995 ............. G06F 13/16

* cited by examiner

*Primary Examiner* — Yaima Rigol
*Assistant Examiner* — Tasnima Matin

(57) ABSTRACT

A method and system for operating a multi-port memory system are disclosed. A memory controller may service read requests by accessing requested data from an external memory and communicating it to the requesting memory ports for access by devices coupled to the memory ports. A shared memory of the memory controller may be used to temporarily store data if a buffer associated with a requesting device is full. To reduce the ability for a slower memory port to occupy the shared memory and cause faster memory ports to be underserviced, the memory controller may advantageously regulate or limit issuance of read requests by memory ports operating at slower clock frequencies. The memory ports may be regulated independently of one another based on at least one respective attribute of each memory port, at least one attribute of the external memory, etc.

25 Claims, 9 Drawing Sheets

METHOD AND SYSTEM FOR OPERATING A MULTI-PORT MEMORY SYSTEM

BACKGROUND OF THE INVENTION

Conventional multi-port memory systems enable multiple devices to access a memory. A memory controller is typically used to arbitrate memory reads and writes of the devices to the memory, where each device connects to a different port of the conventional multi-port memory system. Additionally, each port of the conventional multi-port memory system operates at the same clock frequency to avoid situations where slower ports cause faster ports to be underserviced.

Although conventional multi-port memory systems were used in the past, they are unsuitable for use in a growing number of applications requiring reduced power consumption. Systems often save power by reducing clock frequencies to unused devices while other devices are allowed to operate at higher clock frequencies. However, this is not possible with conventional multi-port memory systems since all devices connected to conventional multi-port memory systems must operate at the same clock frequency.

SUMMARY OF THE INVENTION

Accordingly, a need exists for a multi-port memory system that allows devices to operate at different bandwidths. A need also exists for a multi-port memory system that reduces underservicing of higher-bandwidth ports by lower-bandwidth ports. Further, a need exists for a multi-port memory system that enables bandwidths of multiple devices to be independently configured to adjust power consumption of the system. Embodiments of the present invention provide novel solutions to these needs and others as described below.

Embodiments of the present invention are directed to a method and system for operating a multi-port memory system. More specifically, a memory controller may service read requests by accessing requested data from an external memory and communicating it to the requesting memory ports for access by devices coupled to the memory ports. A shared memory of the memory controller may be used to temporarily store data if a buffer (e.g., a first-in-first-out (FIFO) buffer or other type of buffer) associated with a requesting device is full. To reduce the ability for a lower-bandwidth memory port to occupy the shared memory and cause higher-bandwidth memory ports to be underserviced (e.g., while waiting for the buffer of the lower-bandwidth memory port to be drained to make room for the data stored in the shared memory), the memory controller may advantageously regulate or limit issuance of read requests by memory ports operating at lower bandwidths. The memory ports may be regulated independently of one another based on at least one respective attribute of each memory port (e.g., a clock frequency, width, number of entries, etc.), at least one attribute of the external memory (e.g., a clock frequency, width, etc.), etc. In this manner, clock frequencies or other attributes of the memory ports may be independently adjusted to configure power consumption while increasing service to higher-bandwidth memory ports.

In one embodiment, a method of operating a multi-port memory system includes accessing, at a memory controller, first information associated with a memory. Second information associated with a first memory port and a second memory port is accessed, wherein the second information is associated with a first bandwidth of the first memory port and is further associated with a second bandwidth of the second memory port, wherein the first and second memory ports are operable to accept read commands from a plurality of devices, and wherein the first and second memory ports are further operable to provide data from the memory to the plurality of devices. At least one parameter operable to limit read commands issued by the first memory port is determined based on the first information and the second information. Issuance of read commands by the first memory port is limited based on the at least one parameter.

In another embodiment, a memory controller includes a memory interface operable to communicate with a first memory. The memory controller also includes a multi-port memory interface operable to communicate with a plurality of devices, wherein the multi-port memory interface is operable to implement a first memory port and a second memory port, wherein the first and second memory ports are operable to accept read commands from the plurality of devices, and wherein the first and second memory ports are further operable to provide data from the first memory to the plurality of devices. The memory controller further includes a regulation component operable to access first information associated with the first memory. The regulation component is further operable to access second information associated with the first and second memory ports, wherein the second information is associated with a first bandwidth of the first memory port and is further associated with a second bandwidth of the second memory port. The regulation component is further operable to determine, based on the first information and the second information, at least one parameter operable to limit read commands issued by the first memory port. The regulation component is further operable to limit issuance of read commands by the first memory port based on the at least one parameter.

In yet another embodiment, an integrated circuit includes circuitry operable to implement a plurality of devices, a plurality of buffers coupled to the circuitry, and a memory controller coupled to the plurality of buffers. The memory controller includes a memory interface operable to communicate with a first memory. The memory controller also includes a multi-port memory interface operable to communicate with a plurality of devices, wherein the multi-port memory interface is operable to implement a first memory port and a second memory port, wherein the first and second memory ports are operable to accept read commands from the plurality of devices, and wherein the first and second memory ports are further operable to provide data from the first memory to the plurality of devices. The memory controller further includes a regulation component operable to access first information associated with the first memory. The regulation component is further operable to access second information associated with the first and second memory ports, wherein the second information is associated with a first bandwidth of the first memory port and is further associated with a second bandwidth of the second memory port. The regulation component is further operable to determine, based on the first information and the second information, at least one parameter operable to limit read commands issued by the first memory port. The regulation component is further operable to limit issuance of read commands by the first memory port based on the at least one parameter.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Embodiments of the Present Invention

Figure 1:
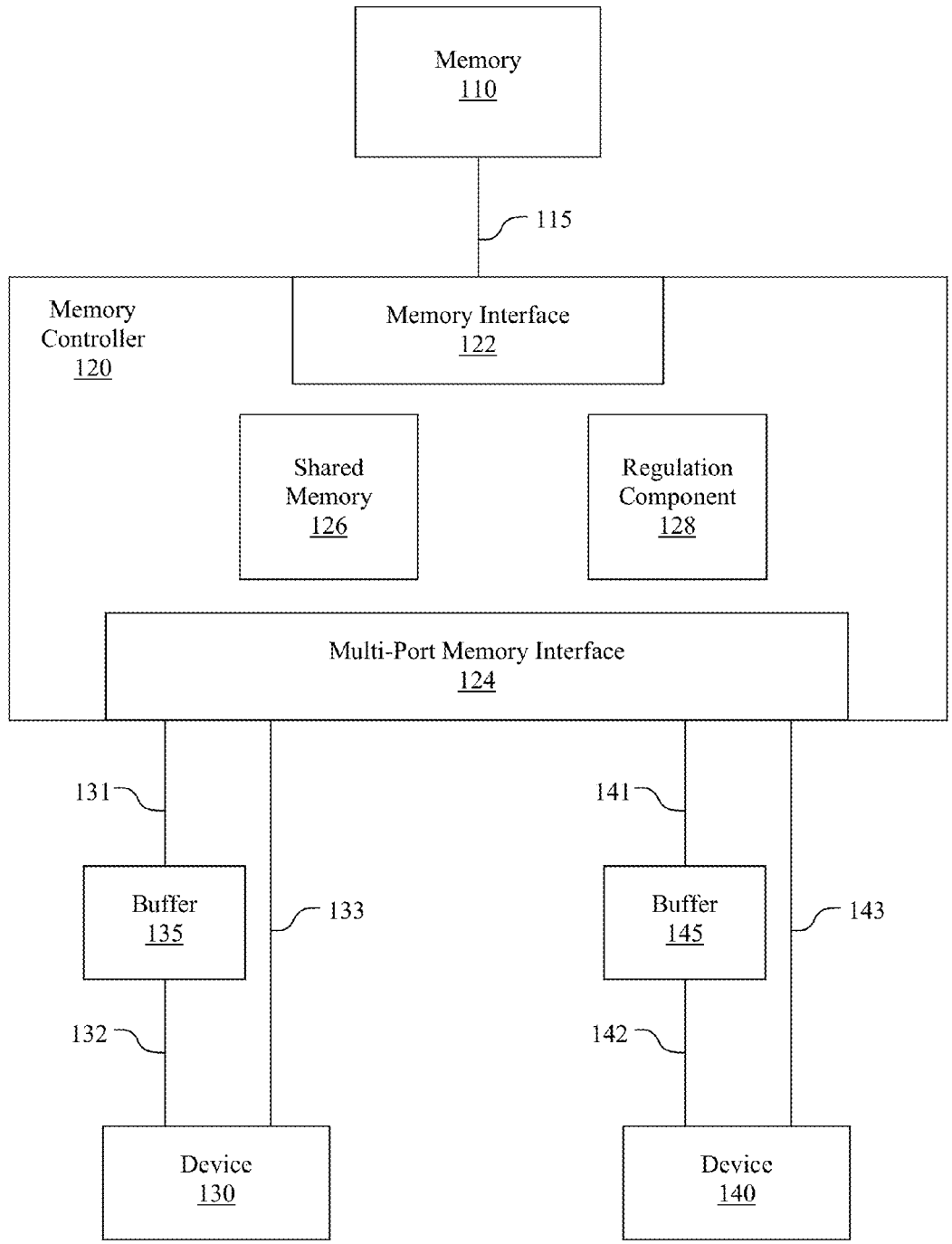
FIG. 1 shows an exemplary multi-port memory system in accordance with one embodiment of the present invention.

FIG. 1 shows exemplary multi-port memory system 100 in accordance with one embodiment of the present invention. As shown in FIG. 1, memory controller 120 includes memory interface 122 for communicating with memory 110 via interface 115. Memory controller 120 also includes multi-port memory interface 124 for communicating with a plurality of devices (e.g., 130, 140, etc.), where each device may communicate with memory controller 120 via one or more paths or interfaces. For example, data may be communicated between device 130 and memory controller 120 via paths 131 and 132, where data may be stored in buffer 135 before and/or after access by device 130 in one embodiment. As another example, data may be communicated between device 140 and memory controller 120 via paths 141 and 142, where data may be stored in buffer 145 before and/or after access by device 140 in one embodiment. And as yet another example, read commands and/or write commands may be issued from a device (e.g., 130, 140, etc.) and/or associated memory port by communicating the read command to memory controller 120 via at least one path (e.g., paths 133 and 143, respectively).

In one embodiment, multi-port memory interface 124 may handle arbitration of memory reads and/or writes for each of the devices (e.g., 130, 140, etc.) coupled thereto. Multi-port memory interface 124 may also handle other functions such as command and data reordering, out-of-order execution of memory commands, collision detection and in-order return of results, dynamically configurable priority scheduling, some combination thereof, etc.

As shown in FIG. 1, multi-port memory interface 124 and/or a buffer (e.g., 135, 145, etc.) may implement at least one memory port allowing data to be accessed by at least one device (e.g., 130, 140, etc.) from memory 110. For example, multi-port memory interface 124 and/or buffer 135 may implement a first memory port allowing data to be accessed by device 130 from memory 110. As another example, multi-port memory interface 124 and/or buffer 145 may implement a second memory port allowing data to be accessed by device 140 from memory 110.

Responsive to issuance of a read command by a memory port and/or a device (e.g., 130, 140, etc.) coupled thereto, memory controller 120 may service the read command by accessing the requested data from an external memory (e.g., 110) and communicating it to the requesting memory port for access by a device (e.g., 130, 140, etc.). Shared memory 126 of memory controller 120 may be used to temporarily store data if a buffer (e.g., 135, 145, etc.) of a requesting memory port is full (e.g., responsive to an overflow of data from the buffer). Shared memory 126 may be a buffer (e.g., a FIFO, another type of buffer, etc.) in one embodiment. Shared memory 126 may store data requested by more than one memory port and/or device, and therefore, may act as a "shared memory" in one embodiment. In this manner, data stored in memory 126 may be communicated to a buffer (e.g., 135, 145, etc.) as the buffer is drained (e.g., data is released from the buffer and communicated to the device that requested the data).

In one embodiment, data may be transferred to shared memory 126 (e.g., for read commands issued by one or more lower-bandwidth memory ports) faster than the data can be drained from shared memory 126. As such, shared memory 126 may be filled by data requested by devices coupled to lower-bandwidth memory ports, thereby reducing the ability to service read commands issued by higher-bandwidth memory ports and/or causing overall system performance to suffer.

The bandwidth or data transfer rate of a memory port may differ from the bandwidth or data transfer rate of at least one other memory port due to one or more factors. For example, the memory ports and/or coupled devices (e.g., 130, 140, etc.) may operate at different clock frequencies, and therefore, may transfer data at different rates. As another example, the devices (e.g., 130, 140, etc.) coupled to the memory ports may accept data at different rates, thereby causing the respective bandwidths of memory ports and/or coupled devices to differ. In one embodiment, logic or other circuitry (e.g., implemented in the fabric of a programmable logic device (PLD) where a PLD is used to implement system 100, user-configurable logic or circuitry, etc.) associated with the access and/ or communication of data by one or more devices may cause the data transfer rate associated with one device to be different from the data transfer rate of one or more other devices (e.g., one device may accept data every other clock cycle while at least one other device can accept data every clock cycle, etc.). In one embodiment, where a device (e.g., 130, 140, etc.) acts as a master (e.g., a soft central processing unit (CPU), another type of device, etc.) and at least one other component or device coupled thereto acts as a slave (e.g., a component coupled to the soft CPU, etc.), temporary congestion associated with the master device (e.g., caused by sudden increase in traffic due to requests by the at least one slave component or device) may cause the data transfer rate associated with one device to be different from the data transfer rate of one or more other devices.

As shown in FIG. 1, memory controller 120 includes regulation component 128 for limiting or otherwise regulating issuance and/or communication of read commands (e.g., to reduce the amount of data stored in shared memory 126 responsive to read commands issued by lower-bandwidth memory ports). For example, to reduce the ability for a lower-bandwidth memory port (e.g., associated with device 130 and buffer 135) to occupy the shared memory (e.g., 126) and cause higher-bandwidth memory ports (e.g., associated with device 140 and buffer 145) to be underserviced (e.g., while waiting for buffer 135 to be drained to make room for the data stored in memory 126), memory controller 120 may regulate or limit issuance of read commands by memory ports (e.g., associated with device 130 and buffer 135) operating at lower bandwidths. The memory ports may be regulated independently of one another based on at least one respective attribute of the memory port (e.g., a clock frequency, width of a buffer, number of entries of a buffer, etc.), at least one attribute of the external memory (e.g., a clock frequency, width, burst length, etc.), some other attribute, etc.

Accordingly, clock frequencies or other attributes of the memory ports may be independently and/or dynamically adjusted to configure power consumption. For example, device 130 and/or the associated memory port may be placed in a low-power state (e.g., by lowing the bandwidth and/or operating clock frequency of device 130 and/or the associated memory port) to reduce power consumption. In one embodiment, at least one other device (e.g., 140) may continue to operate (e.g., using a higher bandwidth and/or higher clock frequency than that of the memory port associated with device 130) while device 130 is in the low-power state.

Further, embodiments of the present invention can reduce underservicing of higher-bandwidth memory ports. For example, by limiting or otherwise regulating issuance of read commands issued by lower-bandwidth memory ports, the amount of data requested by lower-bandwidth memory ports and stored in shared memory 126 can be reduced. Since shared memory 126 has a finite storage capacity and data requested by lower-bandwidth memory ports can prevent or inhibit servicing of read commands issued by higher-bandwidth memory ports (e.g., by occupying space in memory 126 that would otherwise be used to service read commands issued by the higher-bandwidth memory ports), the amount of time that higher-bandwidth memory ports spend waiting on lower-bandwidth memory ports can be reduced.

As shown in FIG. 1, buffer 135 and/or buffer 145 may be first-in-first-out (FIFO) buffers or another type of memory (e.g., circular buffer, queue, stack, etc.). Memory 110 may be dynamic random access memory (DRAM), synchronous DRAM (SDRAM) such as single data rate (SDR), double data rate (e.g., DDR, DDR2, DDR3, etc.), etc. In one embodiment, buffer 135 and/or buffer 145 may operate between at least two different clock frequencies. For example, a first path or interface (e.g., 131, 141, etc.) coupled to a buffer (e.g., 135, 145, etc.) may operate at a first clock frequency (e.g., that of memory controller 120 and/or memory 110, another clock frequency, etc.), whereas a second path or interface (e.g., 132, 142, etc.) may operate at a second clock frequency (e.g., that of device 130 and/or device 140).

Device 130 and/or device 140 may be a processor (e.g., CPU, microprocessor, etc.), graphics processor, digital signal processor, or any other type of user design. Device 130 and/or device 140 may be configured and/or controlled by a user in one embodiment.

Figure 7:
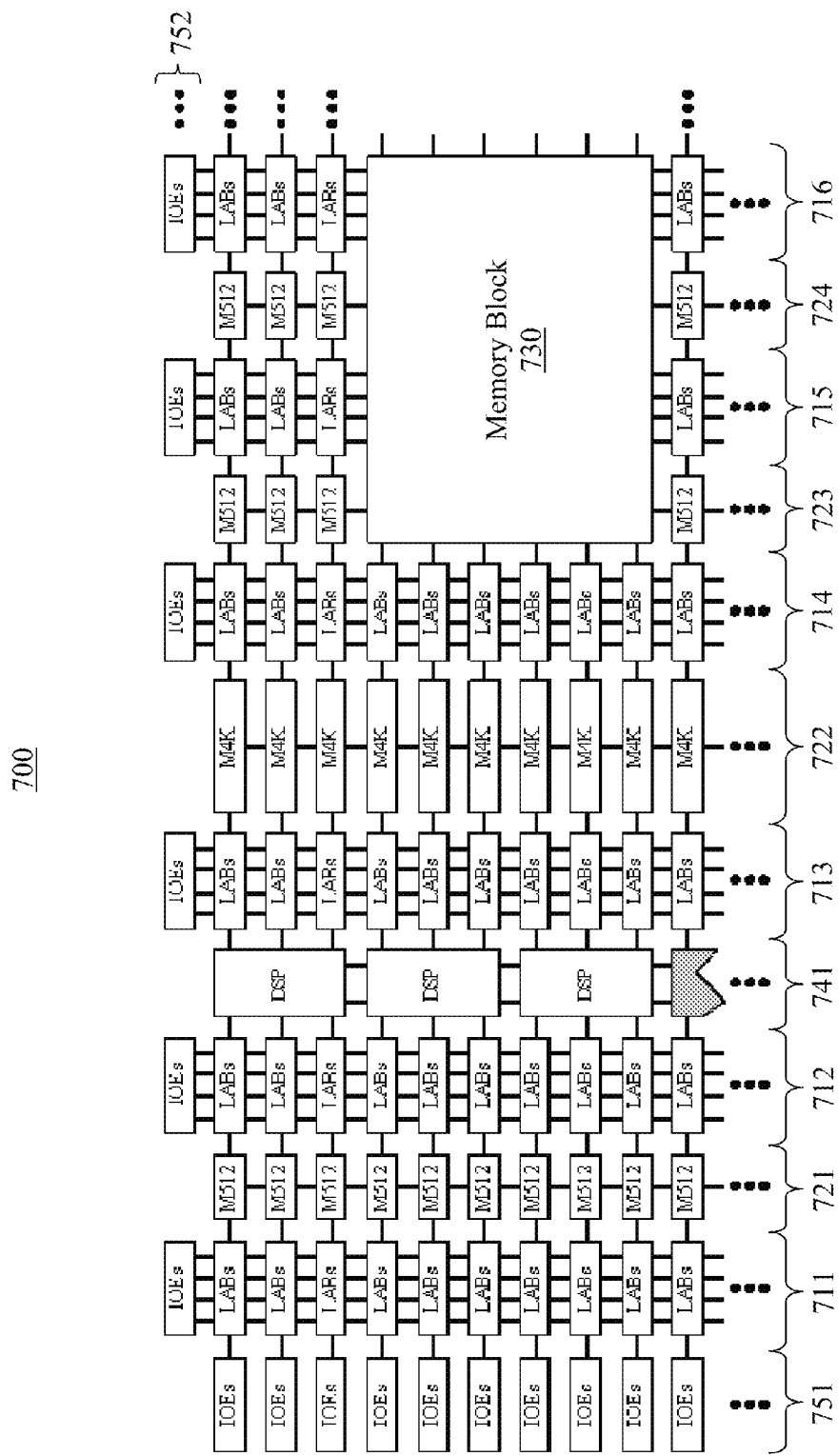
FIG. 7 shows an exemplary programmable logic device (PLD) that can be used to implement one or more aspects of the present invention.

In one embodiment, one or more components of system 100 may be implemented by a programmable logic device (PLD) such as PLD 700 of FIG. 7. For example, memory controller 120, buffer 135, buffer 145, device 130, and device 140 may be implemented by a PLD in one embodiment, where the PLD is operable to communicate with memory 110 which is separate from the PLD. In one embodiment, memory controller 120, buffer 135 and buffer 145 may be hard-coded on the die of the PLD (e.g., separate from the fabric of the PLD), whereas device 130 and device 140 are implemented within the fabric of the PLD. And in other embodiments, different combinations of the components of system 100 may be implemented using a PLD.

Although FIG. 1 shows a specific number of components, it should be appreciated that system 100 may include a different number of components in other embodiments. For example, memory controller 120 may service any number of devices in other embodiments. As another example, memory controller 120 may couple to a plurality of memories (e.g., including at least one memory in addition to memory 110), thereby allowing at least one device (e.g., 130, 140, etc.) to access data from a plurality of memories. As yet another example, memory controller 120 may include a plurality of shared memories in one embodiment. Additionally, although FIG. 1 shows a specific arrangement of components, it should be appreciated that system 100 may include a different arrangement of components in other embodiments.

Figure 2:
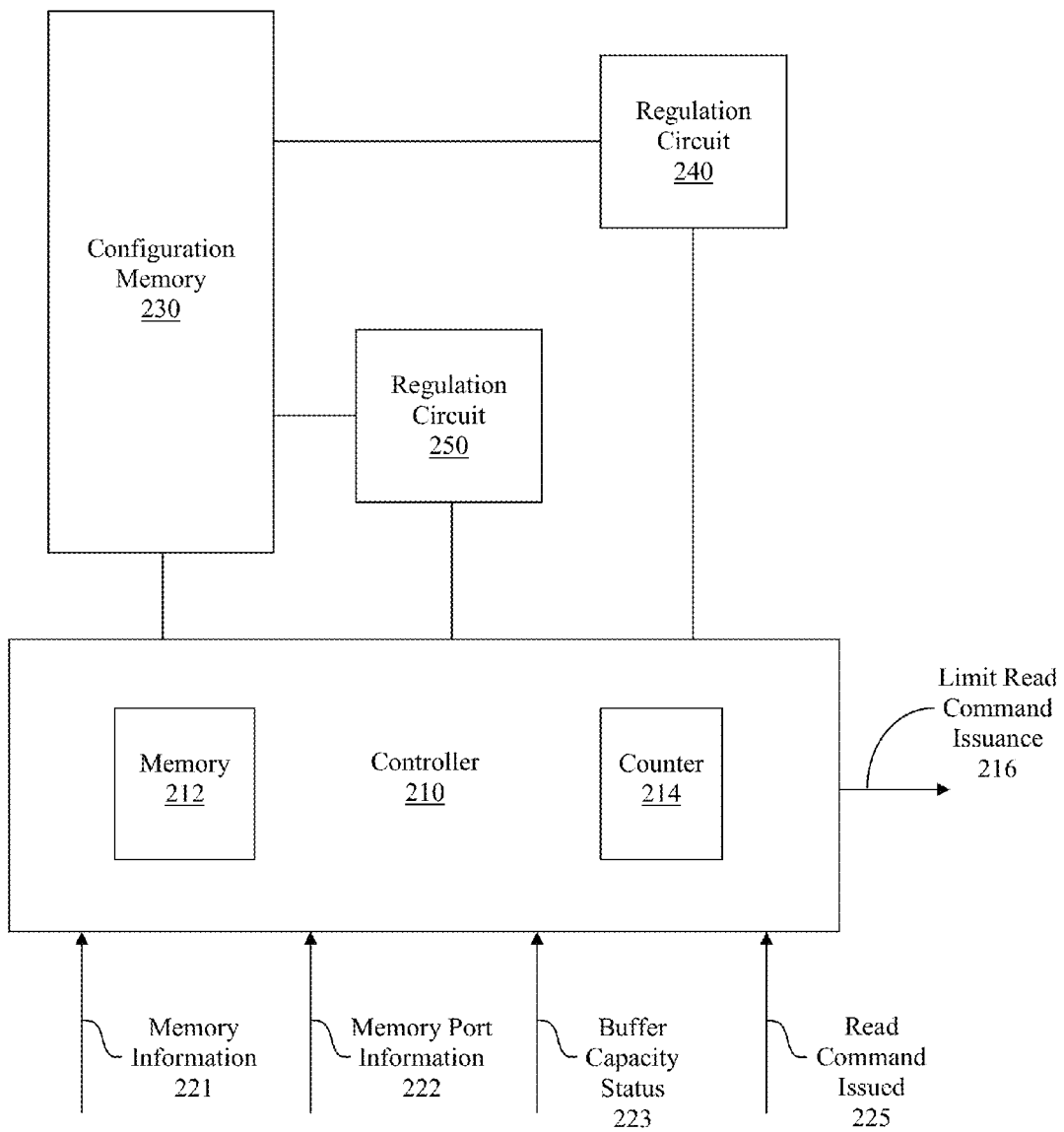
FIG. 2 shows an exemplary regulation component in accordance with one embodiment of the present invention.

FIG. 2 shows exemplary regulation component 128 in accordance with one embodiment of the present invention. As shown in FIG. 2, controller 210 may access memory information 221 (e.g., a clock frequency, width, burst length, another attribute, etc., associated with memory 110) and memory port information 222 (e.g., a clock frequency, width of a buffer, number of entries of a buffer, another attribute, etc., associated with a memory port and/or device coupled thereto) for use in determining at least one parameter for regulating issuance of read commands by at least one memory port. For example, controller 210 may access the memory information 221 and/or memory port information 222 (e.g., from memory 212, from another component of memory controller 120, from another system or device, etc.) and determine a window or duration in which each port will be allocated a respective number of read commands for issuance. The one or more determined parameters (e.g., the window or duration, a first limit associated with a number of read commands allocated to one or more memory ports in the window or duration, a second limit associated with a number of read commands allocated to one or more memory ports in the window or duration, etc.) may be stored in configuration memory 230 for access by at least one regulation circuit (e.g., 240, 250, etc.).

In one embodiment, each regulation circuit (e.g., 240, 250, etc.) may track a number of remaining read commands allocated to a respective memory port during the window or duration. For example, a limit or number of read commands may be accessed (e.g., from configuration memory 230) and used by a regulation circuit (e.g., 240, 250, etc.) as an initial number of read commands allocated to a particular memory port. In one embodiment, a particular limit (e.g., the first limit, the second limit, etc.) may be selected based on a capacity of a buffer (e.g., 135, 145, etc.) associated with the particular memory port (e.g., as determined by buffer capacity status 223). Responsive to the issuance of a read command by the particular memory port (e.g., as determined by the read command issued signal 225), the regulation circuit (e.g., 240, 250, etc.) may decrement a number of remaining read commands allocated to the particular memory port (e.g., by updating a value in configuration memory 230 associated with the number of remaining read commands allocated to the particular memory port). Once the number of remaining read commands reaches zero or some other predetermined value (e.g., as determined by controller 210 responsive to monitoring the number of remaining read commands stored in memory 230), limit read command issuance signal 216 may be issued by controller 210 to cause the particular memory port to limit issuance of read commands.

As shown in FIG. 2, counter 214 may be used to determine expiration of the window or duration. For example, counter 214 may be reset at the beginning of the window or duration and thereafter decremented responsive to each clock cycle associated with memory controller 120 and/or memory 110. Once counter 214 reaches zero or some other predetermined value, it may be determined that the window or duration has expired. In one embodiment, expiration of the window or duration may cause at least one regulation circuit (e.g., 240, 250, etc.) to select another respective limit and/or to refresh or reset the respective number of remaining clock cycles allocated to a respective memory port.

Figure 3:
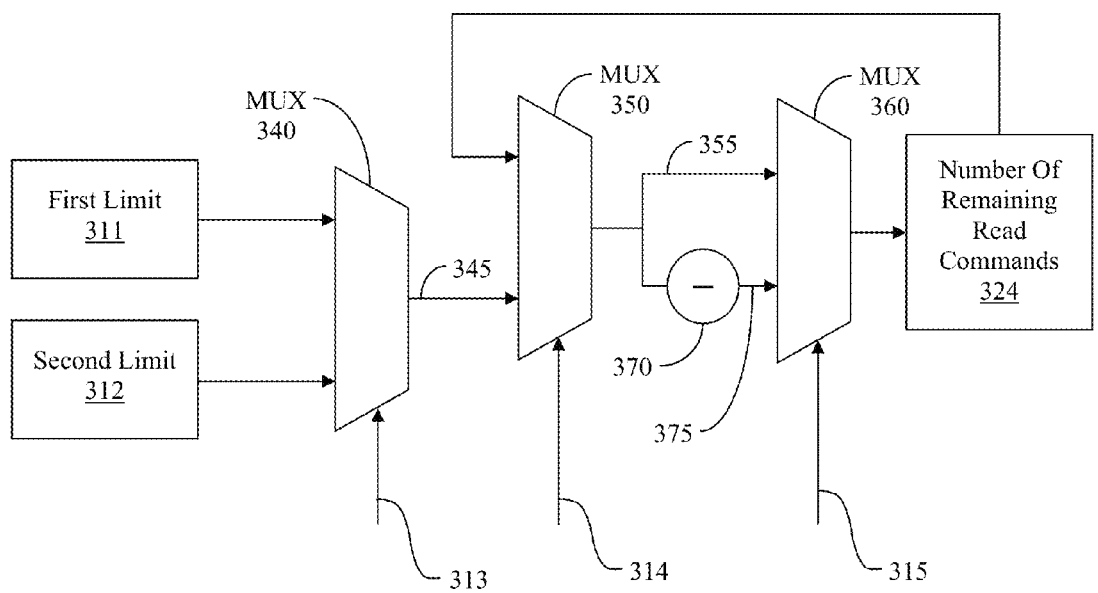
FIG. 3 shows an exemplary regulation circuit in accordance with one embodiment of the present invention.

Although FIG. 3 shows a specific number of components, it should be appreciated that regulation component 128 may include any number of components in other embodiments. For example, regulation component 128 may include any number of regulation circuits (e.g., each for regulating a number of read commands issued to a respective memory port) in other embodiments. Additionally, although FIG. 3 shows a specific arrangement of components, it should be appreciated that components of regulation component 128 may arranged differently in other embodiments.

FIG. 3 shows exemplary regulation circuit 300 in accordance with one embodiment of the present invention. In one embodiment, regulation circuit 300 may be used to implement one or more regulation circuits (e.g., 240, 250, etc.) of regulation component 128.

As shown in FIG. 3, regulation circuit 300 may be used to determine and/or track a number of remaining read commands (e.g., 324) for a memory port. For example, an initial number of remaining read commands (e.g., 324) may be determined (e.g., at the beginning of a window or duration used to regulate read commands issued by the memory port) by accessing either first limit 311 (e.g., a first number of reads commands allocated to the memory port) or second limit 312 (e.g., a second number of reads commands allocated to the memory port). Regulation circuit 300 may thereafter decrement the initial number of remaining read commands (e.g., 324) responsive to each successive read command issuance (e.g., determined based on read command issued signal 225 of FIG. 2) until the number of remaining read commands (e.g., 324) reaches zero or another predetermined value. The current number of remaining read commands 324 may be stored in a memory (e.g., a portion of configuration memory 230, another memory, etc.) accessible to controller 210 in one embodiment.

Accordingly, controller 210 can monitor the number of remaining read commands 324 and assert limit read command issuance signal 216 responsive to detecting that the number of remaining read commands 324 has reached zero or another predetermined value. In this manner, the number of remaining read commands in a window or duration may be independently tracked for each memory port, thereby allowing read command issuance to be independently regulated or limited for each memory port. Additionally, in one embodiment, attributes and/or parameters affecting the regulation of read command issuance for a plurality of ports may be updated or changed in real-time, and thus, embodiments of the present invention allow dynamic and independent regulation of read commands for a plurality of memory ports. Further, in one embodiment, independent and/or dynamic regulation of read commands for a plurality of ports may enable at least one memory port and/or at least one device coupled thereto to be placed in a low-power state to conserve energy (e.g., while at least one other memory port and/or coupled device is operating in a normal or higher-power state, while at least one other memory port and/or coupled device is also placed in a low-power state, etc.).

As shown in FIG. 3, the first limit (e.g., 311) and/or the second limit (e.g., 312) may be selected and used as an initial value for a number of remaining read commands (e.g., 324) using at least one multiplexer (MUX). For example, MUX 340 may select (e.g., based on signal 313) and communicate either the first limit (e.g., 311) or the second limit (e.g., 312) to MUX 350 (e.g., as selected limit 345). MUX 350 may communicate selected limit 345 (e.g., based on signal 314) to MUX 360 as signal 355, where MUX 360 may then output the selected limit (e.g., based on signal 315) as number of remaining read commands 324. In one embodiment, the initial number of remaining read commands (e.g., 324) may be stored in configuration memory 230 (e.g., for later access and use by regulation circuit 300, for access by another component of system 100, etc.). And in one embodiment, regulation circuit 300 may use a selected limit as the initial number of remaining read commands at the beginning of a window or duration associated with regulation or limitation of read command issuance for a memory port (e.g., at the beginning of operation of regulation circuit 300, after reaching zero or a predetermined number of remaining read commands in a previous window or duration, etc.).

Regulation circuit 300 may also decrement a number of remaining read commands (e.g., 324) using at least one MUX. For example, MUX 350 may communicate (e.g., based on signal 314) a number of remaining read commands (e.g., 324) for a particular memory port to decrement component 370. Decrement component 370 may decrement the number of remaining read commands (e.g., 324) by a predetermined value (e.g., one, two, etc.) and output (e.g., based on signal 315) the reduced number of remaining read commands (e.g., 324). In one embodiment, the reduced number of remaining read commands (e.g., 324) may be stored in configuration memory 230 (e.g., for later access and use by regulation circuit 300, for access by another component of system 100, etc.). As such, regulation circuit 300 may be used to track a number of remaining read commands (e.g., 324) within a window or duration for a particular memory port.

Figure 4:
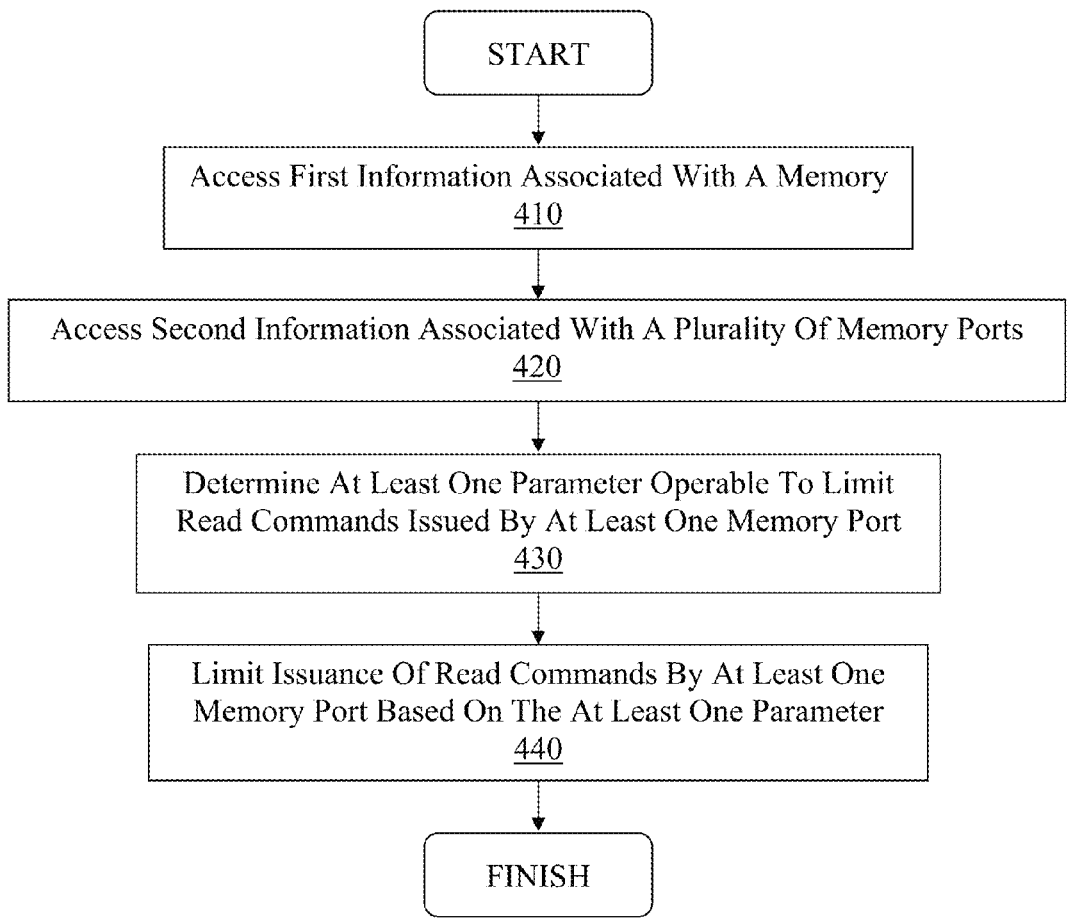
FIG. 4 shows a flowchart of an exemplary computer-implemented process for operating a multi-port memory system in accordance with one embodiment of the present invention.

FIG. 4 shows a flowchart of exemplary computer-implemented process 400 for operating a multi-port memory system in accordance with one embodiment of the present invention. As shown in FIG. 4, step 410 involves accessing first information (e.g., memory information 221 of FIG. 2) associated with a memory (e.g., 110). The first information accessed in step 410 may include a clock frequency (e.g., associated with communication between memory 110 and memory interface 122), a width (e.g., 8 bits, 16 bits, 32 bits, etc.), burst length, some combination thereof, etc. In one embodiment, the first information may include at least one user-configurable attribute associated with the memory (e.g., 110). And in one embodiment, the first information (e.g., 221) may be accessed in step 410 by controller 210 of regulation component 128.

Step 420 involves accessing second information (e.g., memory port information 222 of FIG. 2) associated with a plurality of memory ports (e.g., implemented by memory controller 120, buffer 135, buffer 145, etc.). The second information accessed in step 420 may include a respective clock frequency of each memory port (e.g., associated with communication between buffer 135 and device 130, between buffer 145 and device 140, etc.), a respective width (e.g., 8 bits, 16 bits, 32 bits, 128 bits, etc.) of a respective buffer (e.g., 135, 145, etc.) of each memory port, a respective number of entries of a respective buffer (e.g., 135, 145, etc.) of each memory port, some combination thereof, etc. In one embodiment, the second information may include at least one user-configurable attribute associated with one or more memory ports (e.g., implemented by memory controller 120, buffer 135, buffer 145, etc.). And in one embodiment, the second information (e.g., 222) may be accessed in step 420 by controller 210 of regulation component 128.

In one embodiment, the plurality of memory ports may have different bandwidths or data transfer rates. The differing bandwidths among the memory ports may be caused by a difference in clock frequency (e.g., a first clock frequency of a first memory port is different from a second clock frequency of a second memory port, etc.), a difference in the respective ability or rate at which each coupled device can accept data from the memory port (e.g., caused by logic or other circuitry coupled to the memory ports and/or devices, caused by congestion at a master device due to an increase in traffic of at least one slave device or component coupled to the master device, etc.), some combination thereof, etc.

As shown in FIG. 4, step 430 involves determining at least one parameter operable to limit read commands issued by at least one memory port. In one embodiment, the at least one parameter determined in step 430 may be a number of clock cycles associated with limiting of read commands issued by one or more memory ports (e.g., a window or duration during which one or more memory ports may issue an allocated number of read commands for service by memory controller 120), at least one limit associated with a number of read commands allocated to one or more memory ports, some combination thereof, etc. The at least one parameter may be determined in step 430 by controller 210 of regulation component 128 in one embodiment. And in one embodiment, step 430 may be performed in accordance with process 500 of FIG. 5.

Figure 5:
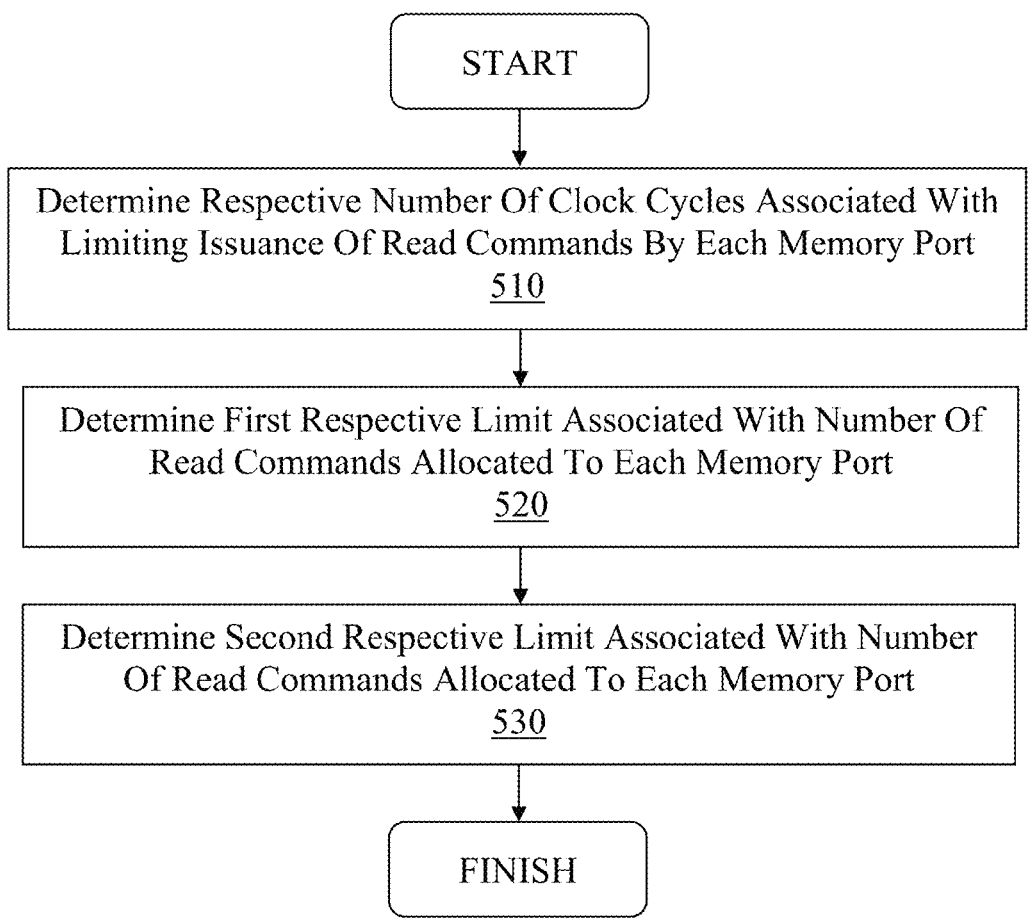
FIG. 5 shows a flowchart of an exemplary computer-implemented process for determining at least one parameter operable to limit read commands issued by at least one memory port in accordance with one embodiment of the present invention.

FIG. 5 shows a flowchart of exemplary computer-implemented process 500 for determining at least one parameter operable to limit read commands issued by at least one memory port in accordance with one embodiment of the present invention. As shown in FIG. 5, step 510 involves determining a respective number of clock cycles associated with limiting issuance of read commands by each memory port (e.g., associated with buffer 135, 145, etc.). For example, step 510 may involve determining a window or duration (e.g., measured in clock cycles of a clock signal accessible to memory controller 120) within which a respective number of read commands (e.g., determined in step 520 and/or step 530) may be issued by each memory port of a plurality of memory ports (e.g., associated with a plurality of buffers coupled to memory controller 120).

In one embodiment, the number of clock cycles may be an integer multiple of a number of clock cycles needed to transfer one memory burst from memory 110 to a device (e.g., 130, 140, etc.). In one embodiment, the number of clock cycles ($N_{cc}$) may be determined in step 510 in accordance with the following equation:

$$N_{cc} = \frac{W_m * BL_m}{W_b} * \frac{F_m}{F_b} * S$$

where $W_m$ is the width of the memory (e.g., as determined in step 410 of process 400), $BL_m$ is the burst length of the memory (e.g., as determined in step 410 of process 400), $W_b$ is the width of the buffer (e.g., as determined in step 420 of process 400), $F_m$ is the clock frequency associated with memory controller 120 and/or the memory (e.g., 110 as determined in step 410 of process 400), $F_b$ is the clock frequency associated with communication between the buffer (e.g., 135, 145, etc.) and the device (e.g., 130, 140, etc.), and S is a user-defined value used to scale the window or duration.

As an example, assume that memory 110 has a width of 16 bits (e.g., is a ×16 memory), a burst length of 8, and operates at a clock frequency of 400 MHz. Also, assume that a buffer (e.g., 135) of a first memory port has a width of 32 bits and communicates with device 130 at a clock frequency of 50 MHz. Further, assume that a buffer (e.g., 145) of a second memory port has a width of 128 bits and communicates with device 140 at a clock frequency of 200 MHz. Where S equals or is otherwise set (e.g., by a user, automatically, etc.) to one, the number of clock cycles for each memory port can be calculated as follows:

First Memory Port: $N_{cc} =$ $$\frac{(16 \text{ bits}) * (8)}{(32 \text{ bits})} * \frac{(400 \text{ MHz})}{(50 \text{ MHz})} * 1 = 32 \text{ clock cycles}$$

Second Memory Port: $N_{cc} =$ $$\frac{(16 \text{ bits}) * (8)}{(128 \text{ bits})} * \frac{(400 \text{ MHz})}{(200 \text{ MHz})} * 1 = 2 \text{ clock cycles}$$

Accordingly, it may be determined that it takes 32 clock cycles to transfer one memory burst from memory 110 to device 130, whereas it takes only 2 clock cycles to transfer one memory burst from memory 110 to device 130.

In one embodiment, the largest of the values calculated in step 510 may be used for subsequent calculations (e.g., in steps 520 and/or 530) for all or some memory ports. For example, 32 clock cycles (e.g., calculated for the first memory port) may be used in subsequent calculations as the window or duration for limiting issuance of read commands for all or some memory ports.

As shown in FIG. 5, step 520 involves determining a first respective limit associated with a number of read commands allocated to each memory port. The first respective limit may be calculated in step 520 by determining a number of clock cycles needed to fill a respective buffer (e.g., 135, 145, etc.) of each memory port according to a data transfer rate associated with memory 110. In one embodiment, the first limit ($L_1$) may be determined in step 520 in accordance with the following equation:

$$L_1 = \frac{W_b * E_b}{D_m}$$

where $W_b$ is the width of the buffer (e.g., as determined in step 420 of process 400), $E_b$ is the number of entries within the buffer (e.g., as determined in step 420 of process 400), and $D_m$ is the amount of data transferred from the memory (e.g., 110) and/or the memory controller (e.g., 120) in one clock cycle.

As an example, assume that memory 110 is double data rate (DDR) memory and has a width of 16 bits and a burst length of 8. Also, assume that a buffer (e.g., 135) of a first memory port has a width of 32 bits and a total of 8 entries. Further, assume that a buffer (e.g., 145) of a second memory port has a width of 128 bits and a total of 8 entries. In this example, the first respective limit for each memory port can be calculated as follows:

First Memory Port: $L_1 = \frac{(32 \text{ bits/entry}) * (8 \text{ entries})}{(32 \text{ bits per clock cycle})} = 8$ clock cycles Second Memory Port: $L_1 =$ $\frac{(128 \text{ bits/entry}) * (8 \text{ entries})}{(32 \text{ bits per clock cycle})} = 32$ clock cycles Accordingly, it may be determined that it takes 8 clock cycles to fill buffer 135, whereas it takes 32 clock cycles to fill buffer 145. As such, in one embodiment, the first limit for the first memory port may be set to 8 read commands, whereas the first limit for the second memory port may be set to 32 read commands. Alternatively, where memory controller 120 can only service one read command per clock cycle across a plurality of memory ports, the first limit for the higher-bandwidth memory port (e.g., the second port in this example) may be set to the difference between $N_{cc}$ and the first limit for the lower-bandwidth memory port (e.g., 32 minus 8 for a first limit of 24 read commands for the higher-bandwidth memory port).

As shown in FIG. 5, step 530 involves determining a second respective limit associated with a number of read commands allocated to each memory port. In one embodiment, the second respective limit calculated in step 530 may be less than the first respective limit calculated in step 520. The second respective limit may be calculated in step 530 by determining a number of read commands that should be issued in the window (e.g., determined in step 510) to cause the amount of data flowing into a buffer (e.g., from multi-port memory interface 124 to buffer 135) to be the same as the amount of data flowing out of the buffer (e.g., from buffer 135 to device 130). In one embodiment, the second limit ($L_2$) may be determined in step 530 in accordance with the following equation:

$$L_2 = N_{cc} * \frac{W_b}{W_m} * \frac{F_b}{F_m}$$

where $N_{cc}$ is the number of clock cycles defining the window or duration for limiting issuance of read commands, $W_b$ is the width of the buffer (e.g., as determined in step 420 of process 400), $F_b$ is the clock frequency associated with communication between the buffer (e.g., 135, 145, etc.) and the device (e.g., 130, 140, etc.), $D_m$ is the amount of data transferred from the memory (e.g., 110) and/or the memory controller (e.g., 120) in one clock cycle, and $F_m$ is the clock frequency associated with memory controller 120 and/or the memory (e.g., 110 as determined in step 410 of process 400).

As an example, assume that the number of clock cycles defining the window or duration for limiting issuance of read commands is 32 clock cycles, that memory 110 is double data rate (DDR) memory and has a width of 16 bits and a burst length of 8, and that memory 110 operates at a clock frequency of 400 MHz. Also, assume that a buffer (e.g., 135) of a first memory port has a width of 32 bits and communicates with device 130 at a clock frequency of 50 MHz. Further, assume that a buffer (e.g., 145) of a second memory port has a width of 128 bits and communicates with device 140 at a clock frequency of 200 MHz.

In this example, the second respective limit for each memory port can be calculated as follows:

First Memory Port: $L_2 = (32 \text{ clock cycles}) * \frac{(32 \text{ bits})}{(32 \text{ bits})} * \frac{(50 \text{ MHz})}{(400 \text{ MHz})} = 4$ Second Memory Port: $L_2 =$ $(32 \text{ clock cycles}) * \frac{(128 \text{ bits})}{(32 \text{ bits})} * \frac{(200 \text{ MHz})}{(400 \text{ MHz})} = 64$ Accordingly, it may be determined that 4 read commands should be issued (e.g., within the window or duration determined in step 510) by the first memory port to cause the amount of data flowing into buffer 135 to be the same as the amount of data flowing out of buffer 135. However, where it is determined that 64 read commands should be issued (e.g., within the window or duration determined in step 510) by the second memory port to cause the amount of data flowing into buffer 145 to be the same as the amount of data flowing out of buffer 145, the number of read commands defining the second limit $L_2$ for the second memory port may be reduced to 32 read commands since this is the maximum number of read commands that memory controller 120 can service within a window or duration of 32 clock cycles. And in one embodiment, where memory controller 120 can only service one read command per clock cycle across a plurality of memory ports, the second limit for the higher-bandwidth memory port (e.g., the second port in this example) may be set to the difference between $N_{cc}$ and the second limit for the lower-bandwidth memory port (e.g., 32 minus 4 for a second limit of 28 read commands for the higher-bandwidth memory port).

Turning back to FIG. 4, step 440 involves limiting issuance of read commands by at least one memory port based on at least one parameter (e.g., determined in step 430). In one embodiment, step 440 may be performed in accordance with process 600 of FIGS. 6A, 6B and 6C.

Figure 6A:
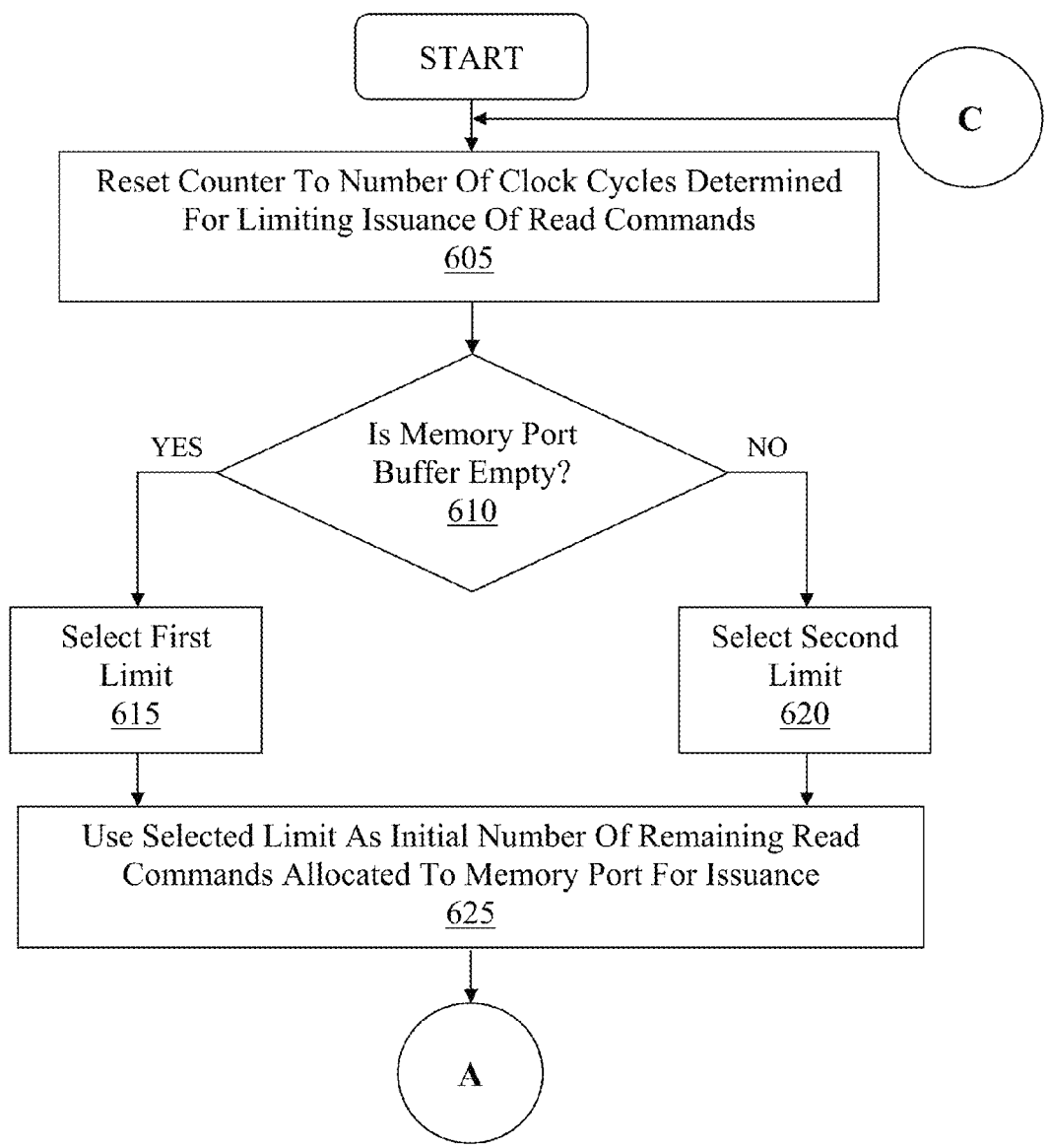
FIG. 6A shows a first portion of a flowchart of an exemplary process for limiting issuance of read commands by at least one memory port based on at least one parameter in accordance with one embodiment of the present invention.
Figure 6B:
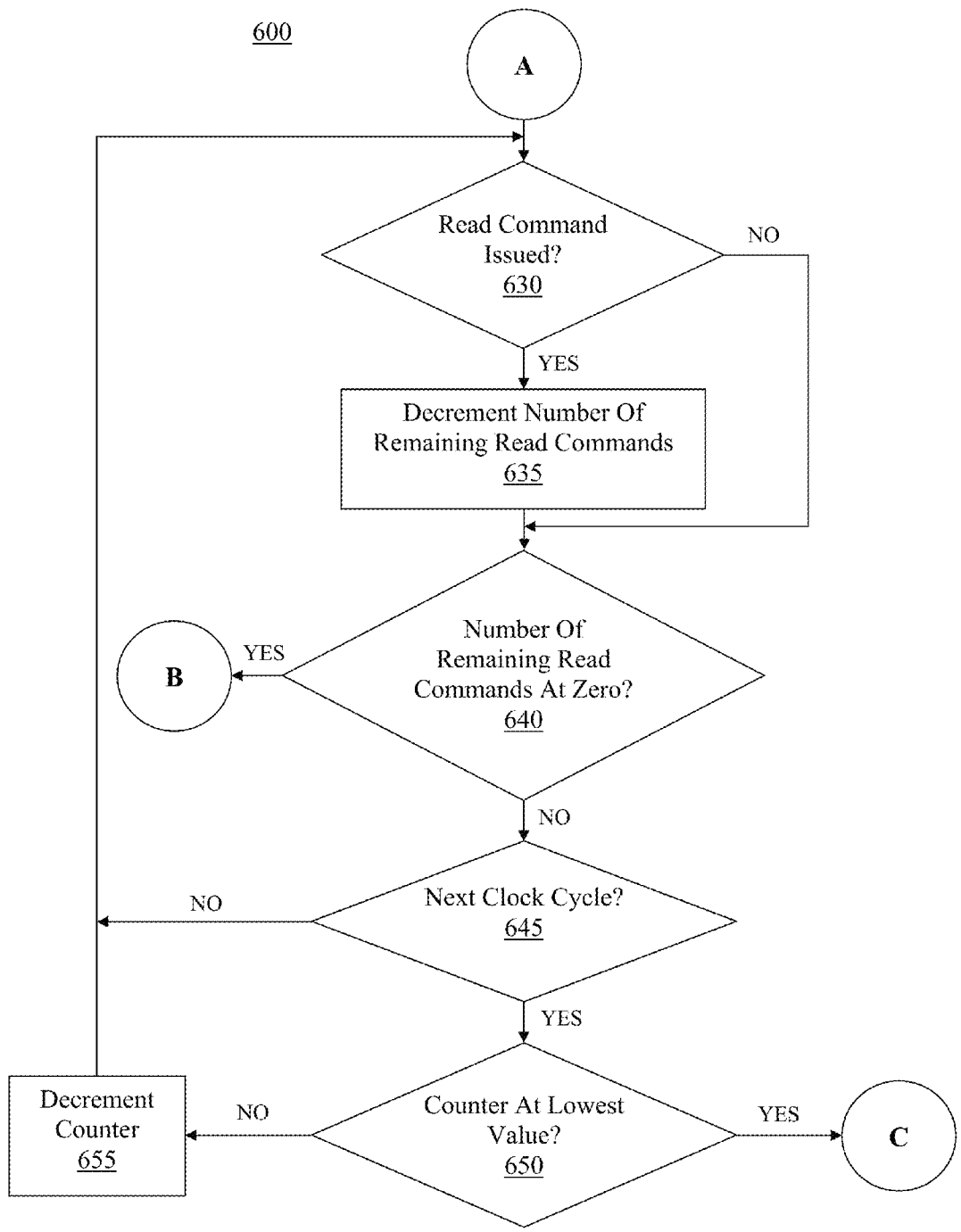
FIG. 6B shows a second portion of a flowchart of an exemplary computer-implemented process for limiting issuance of read commands by at least one memory port based on at least one parameter in accordance with one embodiment of the present invention.
Figure 6C:
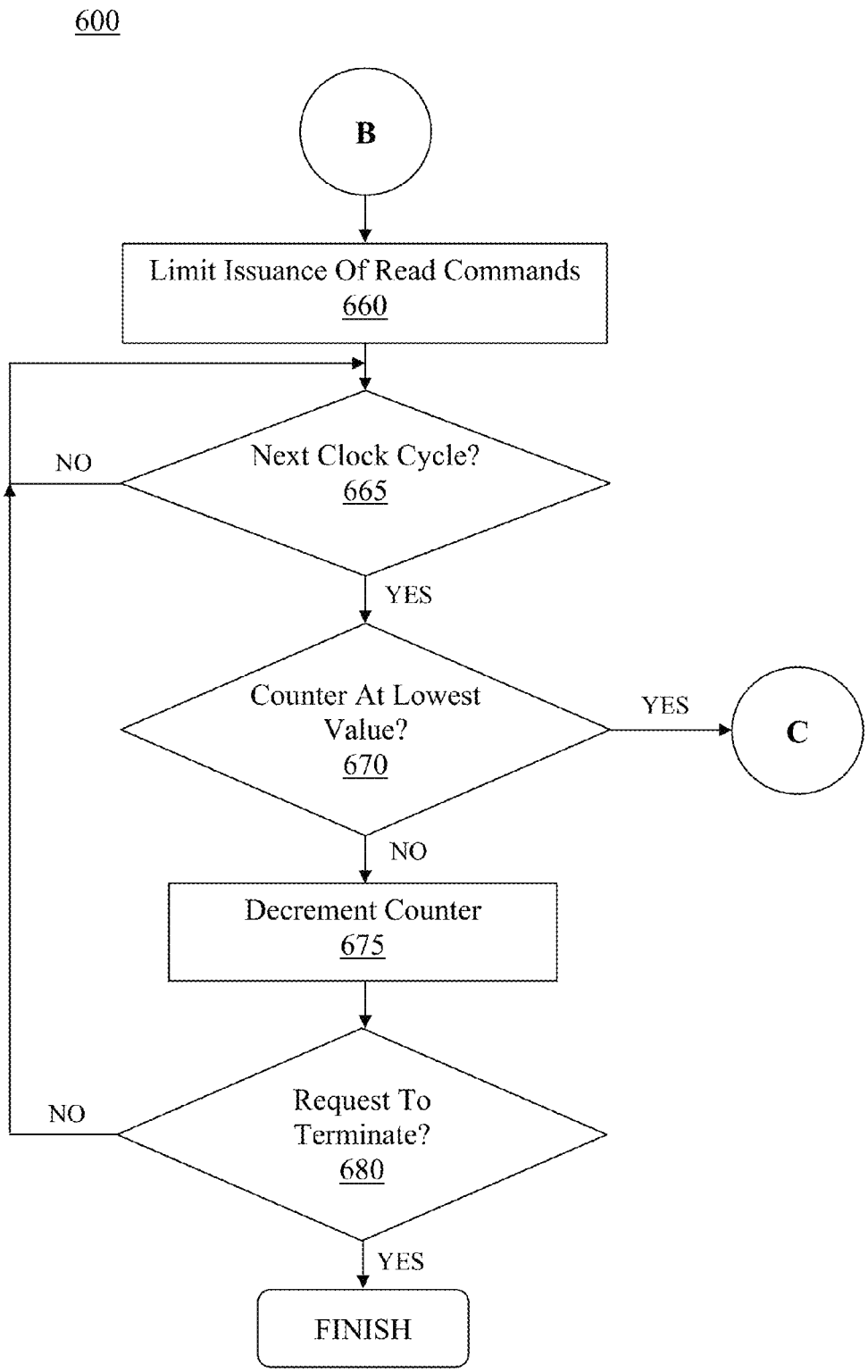
FIG. 6C shows a third portion of a flowchart of an exemplary computer-implemented process for limiting issuance of read commands by at least one memory port based on at least one parameter in accordance with one embodiment of the present invention.

FIGS. 6A, 6B and 6C show a flowchart of exemplary process 600 for limiting issuance of read commands by at least one memory port based on at least one parameter in accordance with one embodiment of the present invention. As shown in FIG. 6A, step 605 involves resetting a counter to a number of clock cycles determined for limiting issuance of read commands (e.g., $N_{cc}$ as determined in step 510 of FIG. 5). In one embodiment, the counter (e.g., 214 of FIG. 2) may be reset in step 605 by controller 210 of regulation component 128.

Step 610 involves determining whether a memory port buffer (e.g., 135, 145, etc.) is empty. In one embodiment, controller 210 may determine whether a memory port buffer (e.g., 135, 145, etc.) is empty in step 610 based on a buffer capacity status (e.g., 223 of FIG. 2).

If it is determined in step 610 that a buffer is empty, then the first limit (e.g., determined in step 520 of FIG. 5) may be selected in step 615. As shown in FIG. 3, the first limit (e.g., 311) may be selected (e.g., and output as selected limit 345) by asserting a signal (e.g., 313) to MUX 340. The first limit (e.g., 311) and/or the limit select signal (e.g., 313) may be generated and/or provided by controller 210 in one embodiment.

Alternatively, if it is determined in step 610 that a buffer is not empty (e.g., at least some data remains in the buffer), then the second limit (e.g., determined in step 530 of FIG. 5) may be selected in step 620. As shown in FIG. 3, the second limit (e.g., 312) may be selected (e.g., and output as selected limit 345) by asserting a signal to MUX 340. The second limit (e.g., 312) and/or the limit select signal (e.g., 313) may be generated and/or provided by controller 310 in one embodiment.

As shown in FIG. 6A, step 625 involves using the selected limit (e.g., 345 as selected in step 615 or step 620) as the initial number of read commands allocated to the memory port for issuance (e.g., during the window or duration specified by $N_{cc}$ as determined in step 510 of FIG. 5). As shown in FIG. 3, the selected limit (e.g., 345) may be used as the initial number of read commands allocated to the memory port by asserting a signal (e.g., 314) to MUX 350 to cause selected limit 345 to be communicated to MUX 360 (e.g., as signal 355) and output as number of remaining read commands 324.

As shown in FIG. 6B, step 630 involves determining whether a read command has been issued (e.g., from a memory port and/or device). Issuance of a read command may be performed or controlled by a memory port (e.g., including or otherwise associated with buffer 135, buffer 145, etc.) and/or a device coupled to a memory port (e.g., 130, 140, etc.). In one embodiment, controller 210 may determine whether a read command has been issued based on read command issued signal 325. If a read command has not been issued, then process 600 may proceed to step 640. Alternatively, if a read command has been issued, then step 635 may be performed.

Step 635 involves decrementing a number of remaining read commands. In one embodiment, controller 210 may decrement a number of remaining read commands by causing number of remaining read commands 324 to pass through MUX 350 (e.g., by asserting signal 314) and through decrement component 370. Signal 375 may represent a reduced number of remaining read commands (e.g., reduced by one, two, or some other amount determined by decrement component 370) that can be passed through MUX 360 (e.g., by asserting signal 315) and be output as a decremented number of remaining read commands 324.

As shown in FIG. 6B, step 640 involves determining if the number of remaining read commands is at zero. In one embodiment, controller 210 may determine if a number of remaining read commands is at zero or a predetermined value based on number of remaining read commands 324 (e.g., accessed from configuration memory 230). If a number of remaining read commands is at zero or the predetermined value, then process 600 may proceed to step 660 of FIG. 6C

(as described herein). Alternatively, if a number of remaining read commands is not at zero (e.g., at least one read command remains to be issued by a memory port) or the predetermined value, then step 645 may be performed.

Step 645 involves determining if a next clock cycle has been detected. Step 645 may be performed (e.g., by controller 210) by monitoring counter 214 to determine if counter 214 has decremented. If the next clock cycle has not yet been detected, then process 600 may proceed back to step 630. Alternatively, if the next clock cycle has been detected in step 645, then step 650 may be performed.

As shown in FIG. 6B, step 650 involves determining if the counter (e.g., 214) is at the lowest value. Step 650 may be performed by controller 210 in one embodiment. If the counter (e.g., 214) is determined to not be at the lowest value (e.g., at least a portion of one clock cycle remains in the window or duration specified by $N_{cc}$ in step 510 of FIG. 5), then the counter (e.g., 214) may be decremented in step 655 and process 600 may proceed back to step 630. Alternatively, if the counter (e.g., 214) is determined to be at the lowest value (e.g., no clock cycles remain in the window or duration specified by $N_{cc}$ in step 510 of FIG. 5), then process 600 may proceed back to step 605 of FIG. 6A where the counter (e.g., 214) may be reset (e.g., by controller 210).

As shown in FIG. 6C, step 660 involves limiting issuance of read commands (e.g., if it is determined in step 640 that the number of remaining read commands is at zero). In one embodiment, a signal (e.g., limit read command issuance signal 316) may be communicated (e.g., by controller 210) to a component of the memory port (e.g., multi-port memory interface 124, buffer 135, buffer 145, etc.) and/or a device (e.g., 130, 140, etc.) coupled to the memory port.

Step 665 involves determining if a next clock cycle has been detected. Step 665 may be performed (e.g., by controller 210) by monitoring counter 214 to determine if counter 214 has decremented. If the next clock cycle has not yet been detected, then step 665 may be repeated (e.g., causing process 600 to wait until the next clock cycle is detected). Alternatively, if the next clock cycle has been detected in step 665, then step 670 may be performed.

As shown in FIG. 6C, step 670 involves determining if the counter (e.g., 214) is at the lowest value. Step 670 may be performed by controller 210 in one embodiment. If the counter (e.g., 214) is determined to be at the lowest value (e.g., no clock cycles remain in the window or duration specified by $N_{cc}$ in step 510 of FIG. 5), then process 600 may proceed back to step 605 of FIG. 6A where the counter (e.g., 214) may be reset (e.g., by controller 210). Alternatively, if the counter (e.g., 214) is determined to not be at the lowest value (e.g., at least a portion of one clock cycle remains in the window or duration specified by $N_{cc}$ in step 510 of FIG. 5), then the counter (e.g., 214) may be decremented in step 675 and process 600 may proceed to step 680.

Step 680 involves determining if a request to terminate process 600 has been detected. If a request to terminate process 600 has not been detected, then process 600 may proceed back to step 665 (e.g., causing process 600 to wait until the window or duration specified by $N_{cc}$ in step 510 of FIG. 5 has expired). Alternatively, if a request to terminate process 600 has been detected, then process 600 may terminate.

Accordingly, limiting issuance of read commands by one or more lower-bandwidth memory ports can increase service of read commands issued by at least one higher-bandwidth memory port. For example, by limiting or otherwise regulating issuance of read commands issued by lower-bandwidth memory ports, the amount of data requested by lower-bandwidth memory ports and stored in memory 126 can be reduced. Since memory 126 has a finite storage capacity and data requested by lower-bandwidth memory ports can prevent or inhibit servicing of read commands issued by higher-bandwidth memory ports (e.g., by occupying space in memory 126 that would otherwise be used to service read commands issued by the higher-bandwidth memory ports), the amount of time that higher-bandwidth memory ports spend waiting on lower-bandwidth memory ports can be reduced.

It should be appreciated that process 600 may be performed for any number of memory ports. In one embodiment, multiple instances of process 600 may be performed sequentially for a plurality of memory ports. And in one embodiment, multiple instances of process 600 may be performed in parallel for a plurality of memory ports.

Turning back to FIG. 4, responsive to a change in one or more attributes (e.g., a width of buffer, a number of entries of a buffer, a clock frequency of a memory port, a width of memory 110, a burst length of memory 110, a clock frequency of memory 110, a scaling value "S" as used in step 410, etc.) used to determine a parameter (e.g., as in step 430 of process 400), step 430 and/or step 440 may be performed again based on the updated value of the parameter (e.g., stored in configuration memory 230 after being determined based on the updated values of the one or more attributes). The one or more attributes (e.g., stored in memory 212) may be changed in real-time, and therefore, at least one memory port and/or at least one other component of system 100 may be dynamically configurable. Additionally, one or more attributes may be changed to independently configure a plurality of memory ports and/or devices. The one or more attributes may be changed by a user, automatically by a component of system 100 or another component coupled thereto, some combination thereof, etc. In this manner, embodiments of the present invention allow limitation of the issuance of read commands to be dynamically adjusted in real-time responsive to changes to the system (e.g., a request to place one or more memory ports and/or devices in a low-power state, a request to change the bandwidth and/or operating frequency of one or more memory ports and/or devices, etc.).

Although only two limits are discussed with respect to the Figures herein, it should be appreciated that any number of limits may be used in other embodiments. For example, where the first limit provides a data transfer rate to a memory port such that a buffer (e.g., 135, 145, etc.) may be filled from empty within the window or duration (e.g., determined in step 510) and where the second limit provides a data transfer rate to a memory port such that the buffer never fills (e.g., the data transfer rate into the buffer equals the data transfer rate out of the buffer), one or more other limits may be determined and/or used to regulate issuance of read commands such that a portion of the buffer is filled within the window or duration. In this manner, embodiments of the present invention allow issuance of read commands to be regulated based on an amount of data in a buffer (or conversely an amount of free space remaining in a buffer) at a given time.

Programmable Logic Device

FIG. 7 shows exemplary programmable logic device (PLD) 700 that can be used to implement one or more components of one or more embodiments of the present invention. For instance, PLD 700 may be used to implement a memory controller (e.g., 110) or at least one component thereof, at least one buffer (e.g., 135, 145, etc.), at least one device (e.g., 130, 140, etc.), some combination thereof, etc. In one embodiment, PLD 700 of FIG. 7 may be used to implement a field programmable gate array (FPGA), a complex programmable logic device (CPLD), a programmable logic arrays (PLA), or some other type of programmable logic device.

As shown in FIG. 7, PLD 700 may include a plurality of programmable logic array blocks (LABs). The LABs of PLD 700 may be arranged in rows and/or columns (e.g., as two-dimensional arrays) in one embodiment. For example, columns 711, 712, 713, 714, 715 and 716 may include one or more LABs. In one embodiment, the LABs may be interconnected by a network of column interconnect conductors and/or row interconnect conductors.

Each LAB may include logic that can be configured to implement one or more user-defined logic functions. For example, the interconnect structure of a LAB may be programmed to interconnect the components of the LAB in one or more desired configurations. A LAB may include at least one look-up table (LUT), at least one register, at least one multiplexer, some combination thereof, etc. In one embodiment, the logic may be organized into a plurality of logic elements (LEs), where the interconnection of the LEs can be programmed to vary the functionality of the LAB.

As shown in FIG. 7, PLD 700 may include a plurality of memory blocks (e.g., memory block 730, memory blocks in columns 721, 722, 723, 724, etc.). In one embodiment, a memory block may include random access memory (RAM), where the RAM may be used to provide multi-port memory, dedicated true dual-port memory, simple dual-port memory, single-port memory, or some combination thereof. And in one embodiment, a memory block may include at least one shift register, at least one first-in-first-out (FIFO) buffer, at least one flip-flop, some combination thereof, etc.

The memory blocks of PLD 700 may be arranged in rows and/or columns (e.g., as two-dimensional arrays) in one embodiment. For example, columns 721, 722, 723 and 724 may include one or more memory blocks. Alternatively, one or more memory blocks (e.g., 730) may be located individually or in small groups (e.g., of two memory blocks, three memory blocks, etc.) in the PLD.

As shown in FIG. 7, PLD 700 may include a plurality of digital signal processing (DSP) blocks. The DSP blocks may provide digital signal processing functions such as FIR filtering, infinite impulse response (IIR) filtering, image processing, modulation (e.g., equalization, etc.), encryption, error correction, etc. The DSP blocks may offer other functionality such as accumulation, addition/subtraction, summation, etc.

PLD 700 may include a plurality of input/output elements (IOEs). Each IOE may include at least one input buffer and/or at least one output buffer coupled to one or more pins of the PLD, where the pins may be external terminals separate from the die of the PLD. In one embodiment, an 10E may be used to communicate input signals, output signals, supply voltages, etc. between other components of the PLD and one or more external devices (e.g., separate form the PLD). In one embodiment, the IOEs may be located at end of the rows and columns of the LABs around the periphery of PLD 700 (e.g., in column 751, in row 752, etc.).

In one embodiment, PLD 700 may include routing resources. For example, PLD 700 may include LAB local interconnect lines, row interconnect lines (e.g., "H-type wires"), column interconnect lines (e.g., "V-type wires"), etc. that may be used to route signals between components of PLD 700.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of operating a multi-port memory system, said method comprising:
 accessing, at a memory controller, first information associated with a memory; accessing second information associated with a first memory port and a second memory port, wherein said second information is associated with a first bandwidth of said first memory port and is further associated with a second bandwidth of said second memory port, wherein said first and second memory ports are operable to accept read commands from a plurality of devices, and wherein said first and second memory ports are further operable to provide data from said memory to said plurality of devices;
 determining, based on said first information and said second information, at least one parameter operable to limit read commands issued by said first memory port;
 selecting a first limit value of two limit values greater than zero, wherein said first limit value comprises a maximum number of read commands for allocation to said first memory port within a first window based on available capacity of said first memory port;
 limiting issuance of read commands by said first memory port within said first window after a total number of read commands issued during said window matches said maximum number of read commands; and
 when said total number of issued read commands reaches said maximum number of read commands, selecting a second limit value of said two limit values for allocation of a reduced number of read commands to said first memory port within a second window succeeding said first window, wherein said second limit value is based on a data transfer rate into a buffer of said first memory port that equals a data transfer rate out of said buffer.

2. The method of claim 1, wherein said first bandwidth is lower than said second bandwidth.

3. The method of claim 1, wherein said at least one parameter is selected from a group consisting of: a number of clock cycles associated with said limiting; said first limit associated with a first number of read commands allocated to said first memory port; and said second limit associated with a second number of read commands allocated to said first memory port.

4. The method of claim 3, wherein said first number of read commands is larger than said second number of read commands, and wherein said determining further comprises:
 if a first buffer associated with said first memory port is empty, selecting said first limit; and
 if said first buffer is not empty, selecting said second limit.

5. The method of claim 1, wherein said first information is selected from a group consisting of a third clock frequency of said memory, a width of said memory, and a burst length of said memory.

6. The method of claim 1, wherein said second information further comprises information selected from a group consisting of: a first width of said first buffer; a second width of a second buffer of said second memory port; a first number of entries of said first buffer; and a second number of entries of said second buffer.

7. The method of claim 1, wherein said first and second memory ports are dynamically and independently configurable.

8. A memory controller comprising:
 a memory interface operable to communicate with a first memory;
 a multi-port memory interface operable to communicate with a plurality of devices, wherein said multi-port memory interface is operable to implement a first memory port and a second memory port, wherein said first and second memory ports are operable to accept read commands from said plurality of devices, and wherein said first and second memory ports are further operable to provide data from said first memory to said plurality of devices; and
 a regulation component operable to access first information associated with said first memory and further operable to:
  access second information associated with said first and second memory ports, wherein said second information is associated with a first bandwidth of said first memory port and is further associated with a second bandwidth of said second memory port;
  determine, based on said first information and said second information, at least one parameter operable to limit read commands issued by said first memory port;
  select a first limit value of two limit values greater than zero, wherein said first limit value comprises a maximum number of read commands for allocation to said first memory port within a first window based on available capacity of said first memory port;
  limit issuance of read commands by said first memory port within said first window after a total number of read commands issued during said window matches said maximum number of read commands; and
  when said total number of issued read commands reaches said maximum number of read commands, select a second limit value of said two limit values for allocation of a reduced number of read commands to said first memory port within a second window succeeding said first window, wherein said second limit value is based on a data transfer rate into a buffer of said first memory port that equals a data transfer rate out of said buffer.

9. The memory controller of claim 8, wherein said first bandwidth is lower than said second bandwidth.

10. The memory controller of claim 8, wherein said at least one parameter is selected from a group consisting of: a number of clock cycles associated with limiting issuance of read commands; said first limit associated with a first number of read commands allocated to said first memory port; and said second limit associated with a second number of read commands allocated to said first memory port.

11. The memory controller of claim 10, wherein said first number of read commands is larger than said second number of read commands, and wherein said regulation component is further operable to:
 if a first buffer associated with said first memory port is empty, select said first limit; and
 if said first buffer is not empty, select said second limit.

12. The memory controller of claim 8, wherein said first information is selected from a group consisting of a third clock frequency of said first memory, a width of said first memory, and a burst length of said first memory.

13. The memory controller of claim 8, wherein said second information further comprises information selected from a group consisting of: a first width of said first buffer; a second width of a second buffer of said second memory port; a first number of entries of said first buffer; and a second number of entries of said second buffer.

14. The memory controller of claim 8, wherein said first and second memory ports are dynamically and independently configurable.

15. The memory controller of claim 8 further comprising:
a second memory operable to store data accessed from said first memory responsive to at least one read command issued by at least one memory port selected from a group consisting of said first memory port and said second memory port.

16. The memory controller of claim 8, wherein said first and second memory ports are implemented by a programmable logic device (PLD).

17. The memory controller of claim 16, wherein said plurality of devices is implemented by said PLD.

18. An integrated circuit comprising:
circuitry operable to implement a plurality of devices;
a plurality of buffers coupled to said circuitry; and
a memory controller coupled to said plurality of buffers, said memory controller comprising:
 a memory interface operable to communicate with a first memory;
 a multi-port memory interface operable to communicate with said plurality of devices, wherein said multi-port memory interface is operable to implement a first memory port and a second memory port, wherein said first and second memory ports are operable to accept read commands from said plurality of devices, and wherein said first and second memory ports are further operable to provide data from said first memory to said plurality of devices; and
 a regulation component operable to access first information associated with said first memory and further operable to:
  access second information associated with said first and second memory ports, wherein said second information is associated with a first bandwidth of said first memory port and is further associated with a second bandwidth of said second memory port;
  determine, based on said first information and said second information, at least one parameter operable to limit read commands issued by said first memory port;
  select a first limit value of two limit values greater than zero, wherein said first limit value comprises a maximum number of read commands for allocation to said first memory port within a first window based on available capacity of said first memory port;
  limit issuance of read commands by said first memory port within said first window, and after a total number of read commands issued during said window matches said maximum number of read commands; and
  when said total number of issued read commands reaches said maximum number of read commands, select a second limit value of said two limit values for allocation of a reduced number of read commands to said first memory port within a second window succeeding said first window, wherein said second limit value is based on a data transfer rate into a buffer of said first memory port that equals a data transfer rate out of said buffer.

19. The integrated circuit of claim 18, wherein said first bandwidth is lower than said second bandwidth.

20. The integrated circuit of claim 18, wherein said at least one parameter is selected from a group consisting of: a number of clock cycles associated with limiting issuance of read commands; said first limit associated with a first number of read commands allocated to said first memory port; and said second limit associated with a second number of read commands allocated to said first memory port.

21. The integrated circuit of claim 20, wherein said first number of read commands is larger than said second number of read commands, and wherein said regulation component is further operable to:
if a first buffer associated with said first memory port is empty, select said first limit; and
if said first buffer is not empty, select said second limit.

22. The integrated circuit of claim 18, wherein said first information is selected from a group consisting of a third clock frequency of said first memory, a width of said first memory, and a burst length of said first memory.

23. The integrated circuit of claim 18, wherein said second information further comprises information selected from a group consisting of: a first width of said first buffer; a second width of a second buffer of said second memory port; a first number of entries of said first buffer; and a second number of entries of said second buffer.

24. The integrated circuit of claim 18, wherein said first and second memory ports are dynamically and independently configurable.

25. The integrated circuit of claim 18, wherein said memory controller further comprises:
a second memory operable to store data accessed from said first memory responsive to at least one read command issued by at least one memory port selected from a group consisting of said first memory port and said second memory port.

\* \* \* \* \*